(12) United States Patent
Yoshizawa (10) Patent No.: US 6,538,490 B2
(45) Date of Patent: Mar. 25, 2003

(54) OFFSET COMPENSATION CIRCUIT AND OFFSET COMPENSATION METHOD

(75) Inventor: Akihiko Yoshizawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/097,307

(22) Filed: Mar. 15, 2002

(65) Prior Publication Data

US 2002/0130696 A1 Sep. 19, 2002

(30) Foreign Application Priority Data

Mar. 16, 2001 (JP) ........................................ 2001-076973

(51) Int. Cl.[7] ................................................. H03L 5/00
(52) U.S. Cl. ...................................................... 327/307
(58) Field of Search .............................. 327/306, 307, 327/334, 355, 361, 362, 363

(56) References Cited

U.S. PATENT DOCUMENTS

| 5,459,679 A | 10/1995 | Ziperovich |
| 5,515,047 A | 5/1996 | Yamakido et al. |
| 5,553,040 A * | 9/1996 | Hanano et al. ........... 369/44.34 |
| 5,945,853 A * | 8/1999 | Sano ............................ 327/87 |
| 6,163,288 A | 12/2000 | Yoshizawa |
| 6,262,619 B1 * | 7/2001 | McGreer et al. ............ 327/307 |

FOREIGN PATENT DOCUMENTS

JP        10-93647        4/1998

* cited by examiner

*Primary Examiner*—Jeffrey Zweizig
(74) *Attorney, Agent, or Firm*—Oblon, Spivak, McClelland, Maier & Neustadt, P.C.

(57) ABSTRACT

An offset compensation circuit comprises an A/D converter, a D/A converter, an attenuator and an analog adder. The A/D converter measures the DC level of an inverting type analog output buffer arranged in an analog signal processing circuit and converts the obtained analog signal into a digital signal. The D/A converter receives the digital signal output from the A/D converter as input and converts the digital signal into an analog signal. The attenuator receives the analog signal output from the D/A converter as input and attenuates its amplitude. The analog adder receives the output signal of the attenuator and that of the analog signal processing circuit as inputs, adds the two signals and supplies the sum signal to the inverting type analog output buffer as input signal of the latter.

28 Claims, 10 Drawing Sheets

OFFSET COMPENSATION CIRCUIT AND OFFSET COMPENSATION METHOD

CROSS REFERENCE TO RELATED APPLICATIONS

This application is based upon and claims the benefits of priority from the prior Japanese Patent Application No. 2001-076973, filed Mar. 16, 2001, the entire contents of which are incorporated herein by reference.

BACKGROUND OF THE INVENTION

1. Field of the Invention

This invention relates to an offset compensation circuit (or offset adjustor) for compensating the DC offset of the output signal of an analog signal processing circuit. Such an offset compensation circuit can suitably be used for a circuit where the DC offset of the output significantly affects the operation and the performance of the analog front-end signal processing LSI of a CD player or a DVD player.

2. Description of the Related Art

Generally, the DC input offset of a stand-alone OP amplifier is produced by mismatches among the performances of the transistors constituting the differential input stage of the amplifier. Causes of such mismatches among the performances of transistors are found mostly in the transistor manufacturing process. Particularly, in the case of MOS transistors, it is highly difficult to reduce the problem simply by improving the manufacturing process.

In view of this fact, methods for compensating (or adjusting) the DC input offset by means of a specifically devised circuit have been developed. Such circuits are marketed and include ICL7650 (trade name, available from INTERSIL), MAX430, 432 (trade names, available from Maxim) and TSC911, 913, 914 (trade names, available from TSC).

Figure 1:
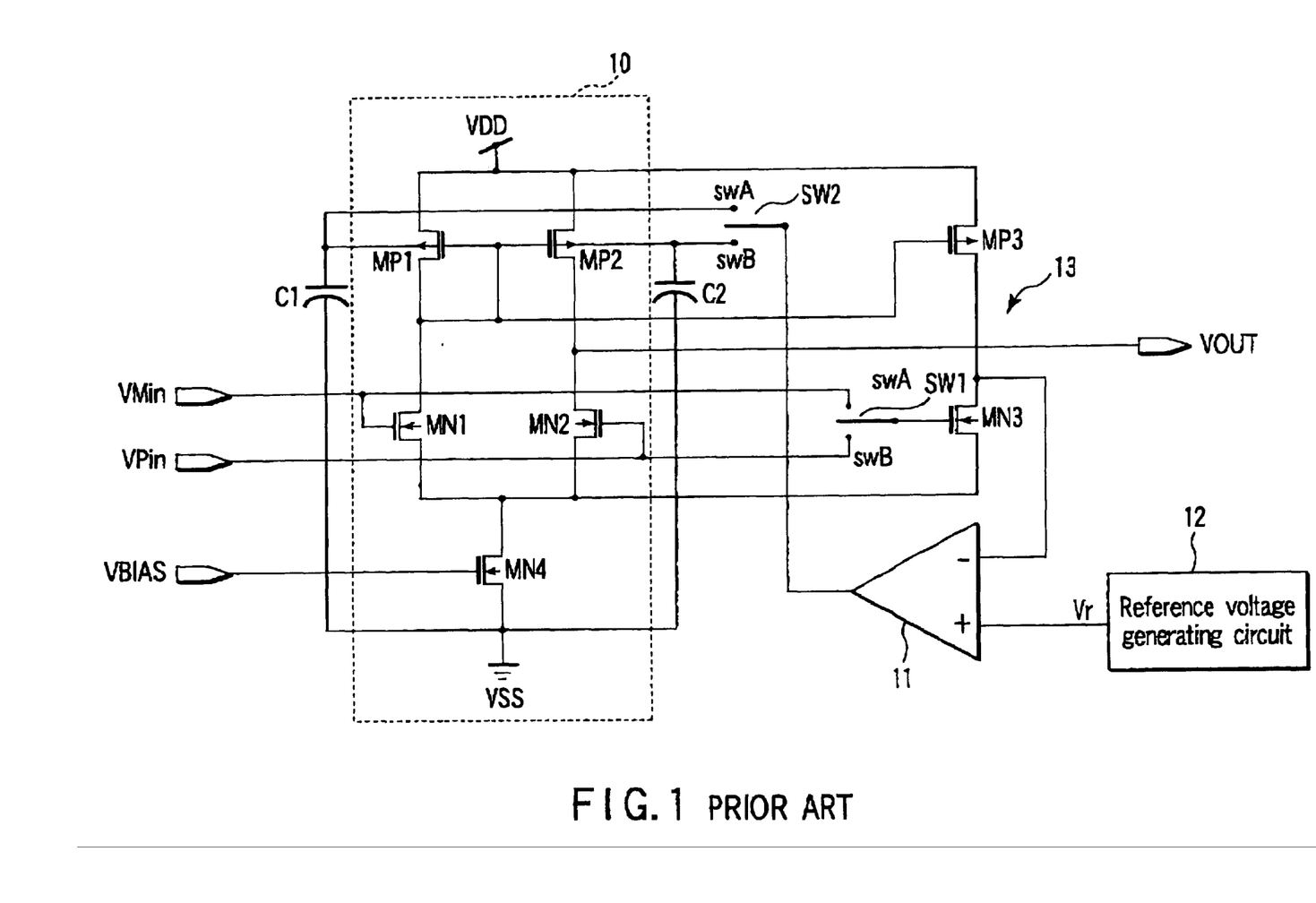
FIG. 1 is a schematic circuit diagram of a chopper-stabilized amplifier, illustrating a conventional offset compensation circuit.

FIG. 1 of the accompanying drawings shows a schematic circuit diagram of a conventional offset compensation circuit for compensating the DC input offset of a stand-alone OP amplifier. The circuit is designed to compensate the DC input offset of an OP amplifier 10 comprising PMOS (P-channel type MOS) transistors MP1, MP2 and NMOS (N-channel type MOS) transistors MN1, MN2, MN4. The OP amplifier 10 receives non-inverted input signal VPin, inverted input signal VMin and bias voltage VBIAS as inputs and outputs output signal VOUT. In an OP amplifier 10 having such a configuration, the mismatch among the performance of the PMOS transistors MP1, MP2 and those of the NMOS transistors MN1, MN2 can give rise to a DC input offset.

The offset compensation circuit is so formed as to comprise a PMOS transistor MP3, an NMOS transistor MN3, switches SW1, SW2, an amplifier 11, a reference voltage generating circuit 12 and capacitors (or capacitive elements) C1, C2.

The circuit as shown in FIG. 1 is referred to as chopper-stabilized amplifier. A chopper-stabilized amplifier comprises an offset detection stage 13 formed by arranging transistors MP3, MN3 for detecting an DC offset and annexed to the ordinary differential stage formed by arranging transistors MP1, MP2 and transistors MN1, MN2.

The offset compensating effect of the offset compensation circuit is realized by alternately connecting the two switches SW1, SW2 to swA side and swB side in FIG. 1. More specifically, when the switches SW1, SW2 are connected to the swA side, a same inverted input signal VMin is input to both of the transistors MN1, MN2. Then, the back gate potential of the transistor MP1 is controlled by the amplifier 11 in such a way that the output level of the transistors MP3 and MN3 are the same level of the reference voltage Vr output from the reference voltage generating circuit 12. When the control session is completed, the output level of the transistors MP1 and MN1 are brought to the level of the reference voltage Vr that is the same output level of the transistors MP3 and MN3.

When, on the other hand, the switches SW1, SW2 are connected to the swB side, a same non-inverted input signal VPin is input to both of the transistors MN2, MN3. Then, the back gate potential of the transistor MP2 is controlled by the amplifier 11 in such a way that the output level of the transistors MP3 and MN3 are the same level of the reference voltage Vr. When the control session is completed, the output level of the transistors MP2 and MN2 are brought to the level of the reference voltage Vr that is the same output level of the transistors MP3 and MN3.

By repeating these two sessions alternately, the output level of the transistors MP1 and MN1 and that of the transistors MP2 and MN2 are controlled to become equal to the same reference voltage Vr. As a result, the error voltages due to the respective DC input offsets are absorbed as the difference of the control voltages for controlling the back gate potentials of the transistors MP1 and MP2. In this way, the respective DC input offsets become compensated.

The capacitors C1 and C2 are used to hold the respective control voltages because the respective back gate terminals of the transistors MP1, MP2 are in a high impedance state when the back gate potentials are not controlled.

However, the above described chopper-stabilized amplifier requires, as annex circuits, a detection stage (transistors MP3 and MN3) for detecting the DC input offsets of the transistors MP1 and MP2, a back gate control amplifier 11, a reference voltage generating circuit 12, capacitors for holding the respective control voltages, and a clock generation circuit for generating a chopping clock. Additionally, since a chopping clock produces switching noise, it cannot be used with a high frequency zone and hence the capacitors C1 and C2 for holding the respective control voltages are inevitably required to have a large capacitance. Then, as a matter of course, there arises a problem of an increased chip size to the LSI.

Figure 2:
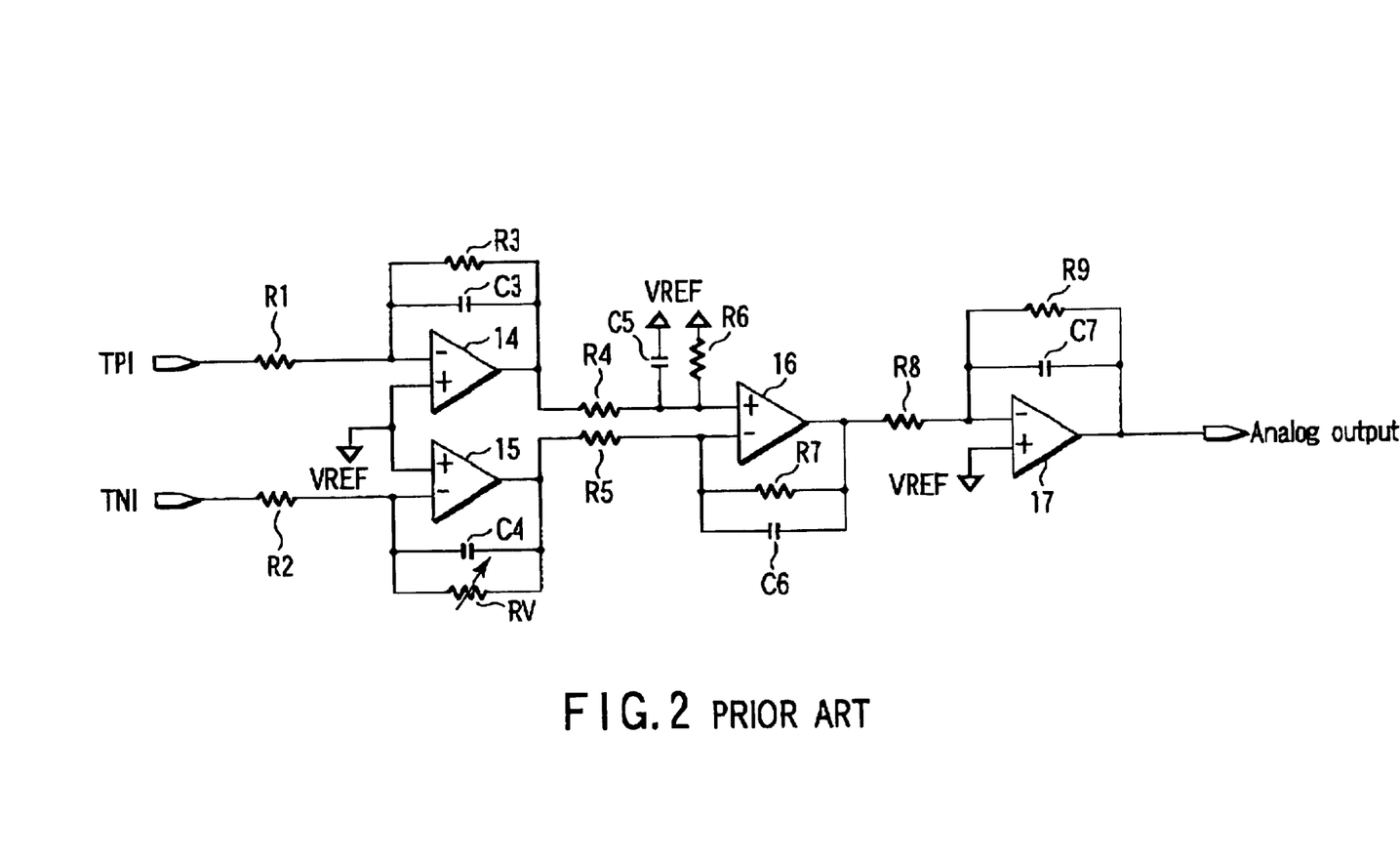
FIG. 2 is a schematic circuit diagram of a conventional analog signal processing circuit provided in an analog front-end signal processing LSI to be used for a CD player or a DVD player.

Meanwhile, practical applications of amplifiers of the type under consideration include analog front-end signal processing LSIs to be used for CD players and DVD players. FIG. 2 shows a typically analog signal processing circuit realized by using such an amplifier. The circuit comprises op amplifiers 14 through 17, resistors (or resistive elements) R1 through R9, a variable resistor RV and capacitors C3 through C7.

When chopper-stabilized amplifiers are used in such a circuit, the circuit needs as many offset compensation circuits as the number of the amplifiers, although a clock generation circuit for generating a chopping clock may be commonly used. It is not unusual that an LSI is realized by using several ten such amplifiers in this field of application. Then, the circuit comprising chopper-stabilized amplifiers will inevitably show large dimensions. This dimensional problem becomes a serious one particularly when analog front-end signal processing LSIs are realized by using MOS transistors.

Beside the dimensional problem, the problem of switching noise produced by the chopping clock also requires consideration and entails cumbersome operations including the selection of the frequency of the chopping clock. While it is possible to reduce the adverse effect of switching noise, switching noise itself cannot be eliminated completely.

Furthermore, when the frequency of the input signal and the frequency of the chopping lock are close to each other, there arises a problem of mutual modulation where the input signal is modulated by the frequency of the chopping clock. This means that the frequency zone available to input signals is limited to by turn limit the scope of application of OP amplifiers.

BRIEF SUMMARY OF THE INVENTION

According to an aspect of the present invention, there is provided an offset compensation circuit comprising; an analog/digital converter configured to measure a DC level of an inverting type analog output buffer in an analog signal processing circuit and convert an analog signal into a digital signal; a digital/analog converter configured to receive the digital signal output from the analog/digital converter as input and convert the digital signal into an analog signal; an attenuator configured to receive the analog signal output from the digital/analog converter as input and attenuate an amplitude of the analog signal; and an analog adder configured to receive the output signal of the attenuator and the output signal of the analog signal processing circuit as inputs, add the output signals and supply a sum signal as input signal to the inverting type analog output buffer.

According to another aspect of the invention, there is provided an offset compensation circuit comprising: an analog/digital converter configured to measure a DC level of a non-inverting type analog output buffer in an analog signal processing circuit and convert an analog signal into a digital signal; a digital/analog converter configured to receive the digital signal output from the analog/digital converter as input and convert the digital signal into an analog signal; an attenuator configured to receive the analog signal output from the digital/analog converter as input and attenuate an amplitude of the analog signal; and an analog subtracter configured to receive the output signal of the attenuator and the output signal of the analog signal processing circuit as inputs, subtract the output signal from the attenuator from the output signal from the analog signal processing circuit and supply a difference signal as input signal to the inverting type analog output buffer.

According to still another aspect of the present invention, there is provided an offset compensation circuit comprising: an analog/digital converter configured to measure a DC level of a non-inverting type analog output buffer in an analog signal processing circuit and convert an analog signal into a digital signal; a digital/analog converter configured to receive the digital signal output from the analog/digital converter as input and convert the digital signal into an analog signal; and an analog subtracter configured to receive the output signal of the digital/analog converter and the output signal of the analog signal processing circuit as inputs, subtract the output signal from the digital/analog converter from the output signal from the analog signal processing circuit and supply a difference signal as input signal to the inverting type analog output buffer.

According to still another aspect of the present invention, there is provided an offset compensation circuit comprising: an analog/digital converter configured to measure a DC level of an analog output buffer in an analog signal processing circuit and convert an analog signal into a digital signal; and first and second register circuits configured to receive and hold the digital signal output from the analog/digital converter; wherein the digital signal held by the first register circuit is input to the analog signal processing circuit and used for analog offset-compensation, and the digital signal held by the second register circuit is input to a digital signal processing circuit and used for digital offset-compensation.

According to still another aspect of the present invention, there is provided a semiconductor integrated circuit device provided with an analog signal processing circuit comprising an offset compensation circuit arranged at an output section of the analog signal processing circuit; the offset compensation circuit including: an analog/digital converter configured to measure a DC level of an inverting type analog output buffer in an analog signal processing circuit and convert an analog signal into a digital signal; a digital/analog converter configured to receive the digital signal output from the analog/digital converter as input and convert the digital signal into an analog signal; an attenuator configured to receive the analog signal output from the digital/analog converter as input and attenuate an amplitude of the analog signal; and an analog adder configured to receive the output signal of the attenuator and the output signal of the analog signal processing circuit as inputs, add the output signals and supply a sum signal as input signal to the inverting type analog output buffer.

According to still another aspect of the present invention, there is provided a semiconductor integrated circuit device provided with an analog signal processing circuit comprising an offset compensation circuit arranged at an output section of the analog signal processing circuit; the offset compensation circuit including: an analog/digital converter configured to measure a DC level of a non-inverting type analog output buffer in an analog signal processing circuit and convert an analog signal into a digital signal; a digital/ analog converter configured to receive the digital signal output from the analog/digital converter as input and convert the digital signal into an analog signal; an attenuator configured to receive the analog signal output from the digital/ analog converter as input and attenuate an amplitude of the analog signal; and an analog subtracter configured to receive the output signal of the attenuator and the output signal of the analog signal processing circuit as inputs, subtract the output signal from the attenuator from the output signal from the analog signal processing circuit and supply a difference signal as input signal to the inverting type analog output buffer.

According to still another aspect of the present invention, there is provided a semiconductor integrated circuit device provided with an analog signal processing circuit comprising an offset compensation circuit arranged at an output section of the analog signal processing circuit; the offset compensation circuit including: an analog/digital converter configured to measure a DC level of a non-inverting type analog output buffer in an analog signal processing circuit and convert an analog signal into a digital signal; a digital/ analog converter configured to receive the digital signal output from the analog/digital converter as input and convert the digital signal into an analog signal; and an analog subtracter configured to receive the output signal of the digital/analog converter and the output signal of the analog signal processing circuit as inputs, subtract the output signal from the digital/analog converter from the output signal from the analog signal processing circuit and supply a difference signal as input signal to the inverting type analog output buffer.

According to still another aspect of the present invention, there is provided a semiconductor integrated circuit device provided with an analog signal processing circuit comprising an offset compensation circuit arranged at an output section of the analog signal processing circuit; the offset compensation circuit including: an analog/digital converter configured to measure a DC level of an analog output buffer in an analog signal processing circuit and convert an analog signal into a digital signal; and first and second register circuits configured to receive and hold the digital signal output from the analog/digital converter, wherein the digital signal held by the first register circuit is input to the analog signal processing circuit and used for analog offset-compensation, and the digital signal held by the second register circuit is input to a digital signal processing circuit and used for digital offset-compensation.

According to still another aspect of the present invention, there is provided an offset compensation method comprising: detecting a DC output offset of an inverting type analog output buffer in an analog signal processing circuit and converting the DC output offset into a digital signal; converting the detected DC output offset level into an analog signal level; attenuating the analog signal level produced by the conversion by an extent equal to the gain of the analog output buffer; adding the attenuated analog signal and the output signal of the analog signal processing circuit and supplying a sum signal to the analog output; and obtaining an output signal from the analog output buffer.

According to still another aspect of the present invention, there is provided an offset compensation method comprising; detecting a DC output offset of a non-inverting type analog output buffer in an analog signal processing circuit and converting the DC output offset into a digital signal; converting the detected DC output offset level into an analog signal level; attenuating the analog signal level produced by the conversion by an extent equal to the gain of the analog output buffer; subtracting the attenuated analog signal from the output signal of the analog signal processing circuit and supplying a difference signal to the analog output; and obtaining an output signal from the analog output buffer.

According to still another aspect of the present invention, there is provided an offset compensation method comprising; detecting a DC output offset of a non-inverting type analog output buffer in an analog signal processing circuit and converting the DC output offset into a digital signal; converting the detected DC output offset level into an analog signal level; subtracting the analog signal level from the output signal of the analog signal processing circuit and supplying a difference signal to the analog output; and obtaining an output signal from the analog output buffer.

According to still another aspect of the present invention, there is provided an offset compensation method comprising: detecting a DC output offset of an analog output buffer in an analog signal processing circuit and converting the DC output offset into a digital signal; holding the detected digital signal in a first register circuit; feeding back the digital signal held in the first register circuit to the analog signal processing circuit and analog compensation the offset; detecting the DC output offset level in the analog signal processing circuit and converting the DC output offset again into a digital signal; holding the detected digital signal in a second register; and inputting the digital signal held in the second register into a digital signal processing circuit and digital compensation the offset.

DETAILED DESCRIPTION OF THE INVENTION

Figure 3:
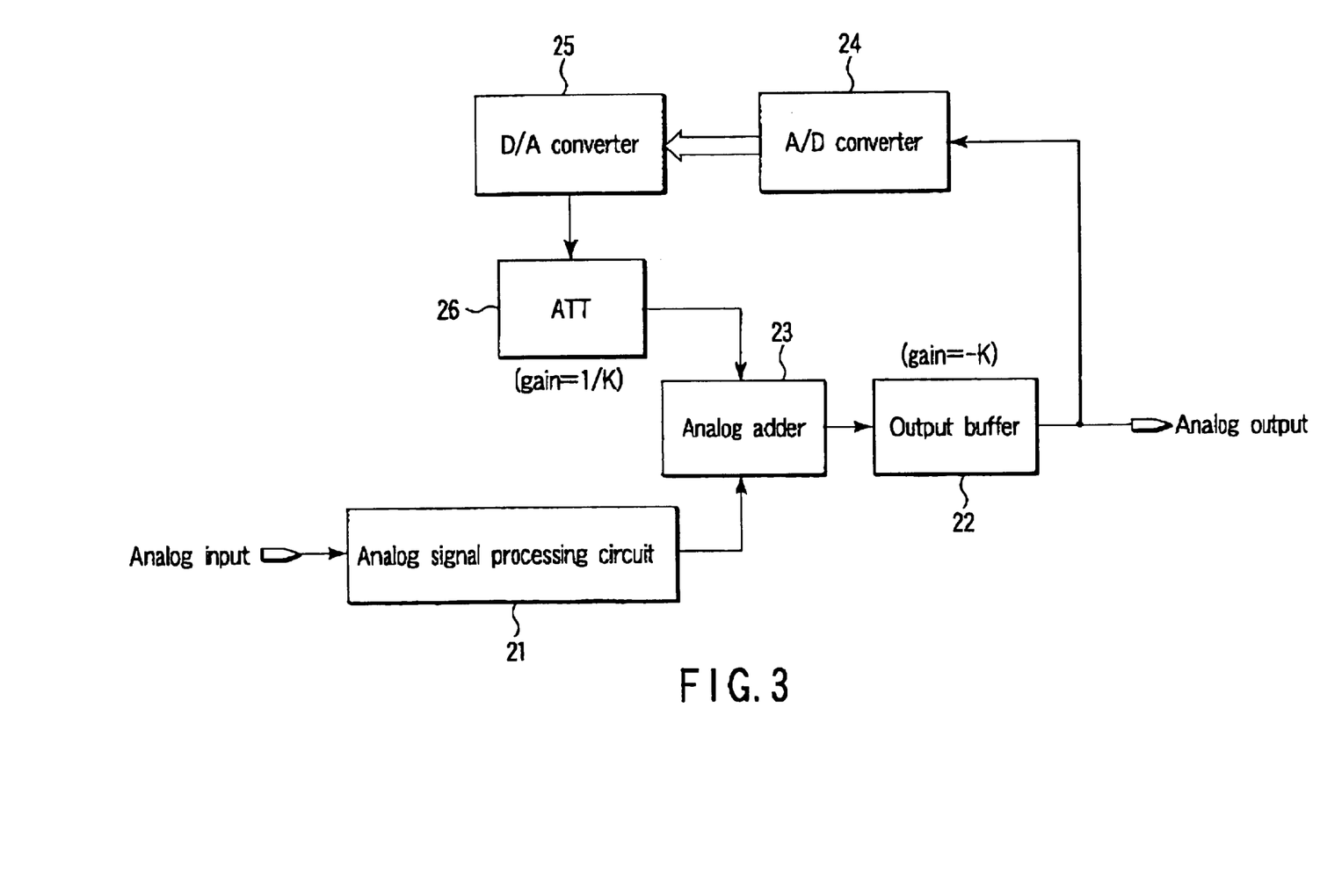
FIG. 3 is a schematic block diagram of an offset compensation circuit according to a first embodiment of this invention.

FIG. 3 is a schematic block diagram of the offset compensation circuit according to the first embodiment of this invention. Note that FIG. 3 shows an analog signal processing circuit and an offset compensation circuit provided in a semiconductor integrated circuit device. The offset compensation circuit is arranged at the output section (inverting type analog output buffer 22) of the analog signal processing circuit 21. The offset compensation circuit comprises an analog adder 23, analog/digital (A/D) converter 24, a digital/analog (D/A) converter 25 and an analog attenuator (ATT) 26.

An analog signal is input to the analog signal processing circuit 21 and subjected to a predetermined signal processing operation. The output signal of the circuit 21 is supplied to one of the input terminals of the analog adder 23. The analog signal output from the output buffer 22 is supplied to the outside or a circuit of the next stage and also to the A/D converter 24 for measuring a DC level of the output buffer 22, where it is converted into a digital data (digital signal). The output signal of the A/D converter 24 is supplied to the D/A converter 25 and converted into an analog data (analog signal). Then, the obtained analog signal is attenuated by the attenuator 26 and supplied to the other input terminal of the analog adder 23. The analog adder 23 adds the output signal of the analog signal processing circuit 21 and the output signal of the analog attenuator 26 and supplies the sum signal to the output buffer 22.

Thus, in the circuit of FIG. 3, the A/D converter 24 is used to detect the DC output offset of the output buffer 22 of the analog signal processing circuit 21 and convert the detected DC output offset level into a digital value. The digital value obtained as a result of the conversion is then converted into an analog signal level by means of the D/A converter 25 in order to feedback to the analog signal processing circuit. If the gain of the output buffer 22 is K times, the level of the analog signal obtained as a result of the conversion is attenuated by an extent that corresponds to the gain (1/K) of the output buffer 22. If the output buffer 22 is an inverted type, the analog adder 23 is used to add the attenuated analog signal and the output signal of the analog signal processing circuit 21. The attenuated analog signal is a signal that is obtained by multiplying the DC output offset level of the analog signal processing circuit 21 by the gain (−K) of the inverting type output buffer 22 and attenuated by (1/K) times by the analog attenuator 26. In other words, the attenuated analog signal shows an inverted analog signal level same as the DC output offset level of the analog signal processing circuit 21 from which it originates.

Thus, the output signal of the analog adder 23 obtained by adding the two signals shows an output signal level that is free from the DC output offset of the analog signal processing circuit 21 from which the analog signal originates. Therefore, the output of the inverting type output buffer 22 also shows an output signal level that is free from the DC output offset.

On the other hand, if the analog output buffer 22 is of the non-inverting type, a subtracter is used to subtract the attenuated analog signal from the output signal of the analog signal processing circuit 21. The attenuated analog signal is a signal that is obtained by multiplying the DC output offset level of the analog signal processing circuit 21 by the gain (K) of the non-inverting type output buffer and attenuated by (1/K) times by the analog attenuator 26. In other words, the attenuated analog signal shows an analog signal level same as the DC output offset level of the analog signal processing circuit 21 from which it originates.

Thus, the output signal of the analog subtracter obtained by subtracting the attenuated analog signal from the output signal of the analog signal processing circuit 21 shows an output signal level that is free from the DC output offset of the analog signal processing circuit 21 from which the analog signal originates. Therefore, the output of the non-inverting type output buffer also shows an output signal level that is free from the DC output offset.

Note that, if the gain of the inverting or non-inverting type analog output buffer 22 is K1 and the gain of the analog/digital converter 24 is K2, the attenuation ratio of the attenuator 26 may be made substantially equal to the reciprocal of the product of multiplication of the two gains, or 1/(K1×K2). With this arrangement, it is possible to compensate the DC output offset, taking the gain of the analog/digital converter 24 into consideration.

The resolution of the analog/digital converter and that of the digital/analog converter in the circuit of FIG. 3 need to be selected as a function of the tolerance limit of the DC output offset in the circuit where the offset compensation circuit is applied. If the tolerance limit of the DC output offset is as large as several mV, a resolution of about 8 bits may be sufficient.

Conventionally, since the signal for compensating the DC output offset is an analog value in the case of a chopper-stabilized amplifier, the use of a capacitor for holding an analog value is necessary. Additionally, it is also necessary to repeat a detection and compensation cycle in order to maintain the analog value to a constant level for the purpose of dynamic operations. To the contrary, since the signal for compensating the DC output offset of this embodiment is a digital value that can be held easily. Therefore, in this embodiment, it is only necessary to compensate the DC output offset just once in the initializing stage when power is supplied. Thus, the operation of designing the circuit and that of driving the circuit are not subjected to any limitations that are related to offset compensation.

Since the analog/digital converter 24 is driven to operate only once for detecting the DC output offset level, it may be shared by some other circuit on a time division basis. On the other hand, the digital/analog converter 25 and other circuit components are necessary only for the output of the analog signal processing circuit. Therefore, while the use of chopper-stabilized amplifiers may be advantageous from the viewpoint of circuit dimensions when the number of installed operational amplifiers is relatively small, the offset compensation method of this embodiment becomes more advantages as the number of operational amplifiers increases. Particularly, in the case of an analog signal processing circuit in an analog front-end signal processing LSI to be used in a CD player or a DVD player (disk drive data storage system), the circuit dimensions can be significantly reduced to by turn reduce the manufacturing cost by using the compensation method of this embodiment because the number of operational amplifiers in the circuit is very large.

Additionally, since this embodiment does not require the use of chopping clocks that are contained in chopper-stabilized amplifiers, it is free from the problem of noise and that of mutual modulation involved in chopping clocks.

Furthermore, while a chopper-stabilized amplifier can compensate only offsets attributable to amplifiers, this compensation method of this embodiment can compensate any offsets attributable to factors other than amplifiers particularly in terms of DC offsets of analog outputs. Therefore, this embodiment can take a significant role for improving the offset characteristics of the entire system. For example, it can compensate output offsets attributable to external parts (such as laser diodes of pickup heads of CD players and DVD players).

Still additionally, this embodiment can accurately compensate offsets and adapt itself to a large offset voltage of an analog input signal when the circuit is configured so as to operate for both analog offset-compensation and also digital offset-compensation. This means that less expensive external parts can be used with an analog signal processing circuit to a great advantage of reducing the cost of the entire system.

Finally, a DC offset can be regulated software-wise by processing the digital data input to an offset compensating digital/analog converter by means of this embodiment. In other words, this embodiment can be applied to a situation where a control process using hardware is not feasible and a special control technique is required.

Figure 4:
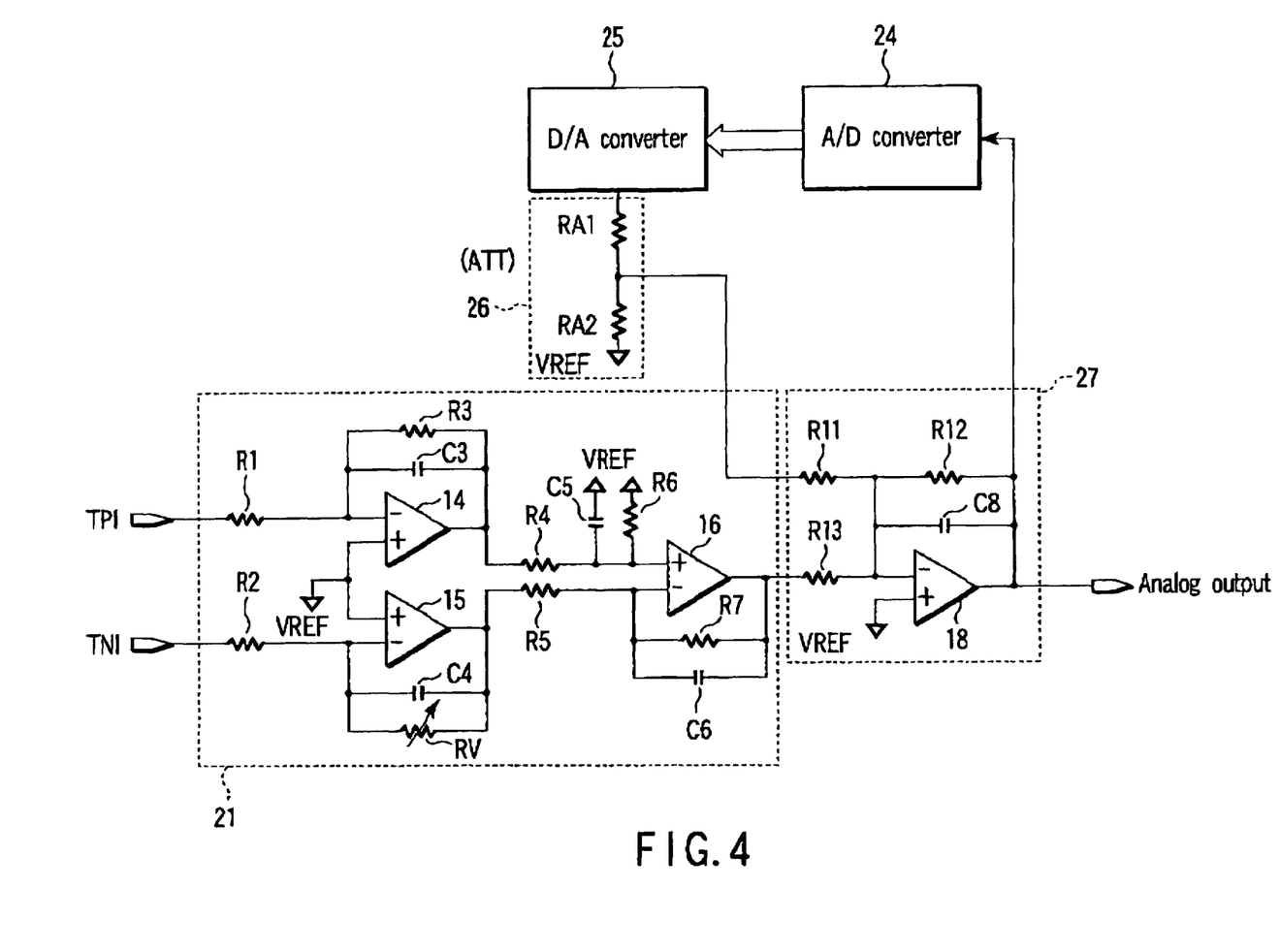
FIG. 4 is a schematic circuit diagram of an analog signal processing circuit, an analog adder, an output buffer and an analog attenuator, all provided in for the offset compensation circuit of FIG. 3.

FIG. 4 is a schematic circuit diagram of the analog signal processing circuit 21, the analog adder 23, the output buffer 22 and the analog attenuator 26 of the offset compensation circuit of FIG. 3, illustrating the circuit configuration of these circuits.

The analog signal processing circuit 21 of FIG. 4 is basically similar to its counterpart of FIG. 2 and comprises OP amplifiers 14 through 17, resistors R1 through R7, a variable resistor RV and capacitors (capacitive elements) C3 through C6. Analog signals TP1, TN1 are supplied respectively to the resistors R1, R2 at one of the terminals of each of them. The other terminals of these resistors R1, R2 are connected respectively to the inverted input terminals (−) of the operational amplifiers 14, 15. The resistor R3 and the capacitor C3 are connected in parallel between the output terminal and the inverted input terminal (−) of the operational amplifier 14, while the non-inverted input terminal (+)

thereof is connected to a reference voltage source VREF (normally at a level of power supply voltage VDD/2). The variable resistor RV and the capacitor C4 are connected between the output terminal and the inverted input terminal (−) of the operational amplifier, while the non-inverted input terminal (+) thereof is connected to the reference voltage source VREF. The output terminals of the operational amplifiers 14, 15 are connected respectively to the resistors R4, R5 at one of the terminals of each of them, while the other terminals of these resistors R4, R5 are connected respectively to the non-inverted input terminal (+) and the inverted input terminal (−) of the operational amplifier 16. The resistor R6 and the capacitor C5 are connected in parallel between the non-inverted input terminal (+) of the operational amplifier 16 and the reference voltage source VREF. The resistor R7 and the capacitor C6 are connected in parallel between the output terminal and the inverted input terminal (−) of the operational amplifier 16. The output signal of the operational amplifier 16 is supplied to an analog adder and the output buffer 27.

The analog adder and the output buffer 27 that are combined in FIG. 4 correspond respectively to the analog adder 23 and the output buffer 22 of FIG. 3 and comprise an operational amplifier 18, resistors R11 through R13 and a capacitor C8. The non-inverted input terminal (+) of the operational amplifier 18 is connected to the reference voltage source VREF, while its inverted input terminal (−) is connected to one of the terminals of each of the resistors R11, R13. The other terminal of the resistor R13 is connected to the output terminal of the operational amplifier 16. The resistor R12 and the capacitor C8 are connected in parallel between the output terminal and the inverted input terminal (−) of the operational amplifier 18. The output signal of the operational amplifier 18 is supplied externally or to some other circuit and also to the A/D converter 24 as analog output.

The analog attenuator 26 comprises resistors RA1, RA2. One of the terminals of the resistor RA1 is connected to the output terminal of the D/A converter 25 and the resistor RA2 is connected between the other terminal of the resistor RA1 and the reference voltage source VREF. The connection point of the resistors RA1, RA2 is connected to the other terminal of the resistor R11.

In the circuit of FIG. 4, the analog adder and the output buffer 27 operate as an inverting type buffer. Its gain is determined by the ratio of the resistance of the resistor R11 to that of the resistor R12 and expressed by the formula of gain Ko=−R12/R11. The output of the analog signal processing circuit 21 and the output of the attenuator 26 are connected respectively to the resistor R13 and the resistor R11. In other words, the circuit operates also as analog adder.

The attenuation ratio for the attenuator 26 comprising the resistors RA1 and RA2 and connected to the output terminal of the D/A converter 25 is substantially equal to the reciprocal of the gain K (1/K) of the inverting type analog output buffer. In other words, the equation of (1/K)=RA2//R1/(RA1+RA2//R1) holds true. Therefore, the resistance of the resistor RA1 and that of the resistor RA2 need to be determined as a function of the gain Ko of the output buffer.

The gain Km of the output buffer where the output signal of the analog signal processing circuit 21 is input is expressed by the equation of Km=−R12/R13. The gain of the offset compensation side and the gain Km of the output side of the analog signal processing circuit 21 do not to be equal to each other.

With the above described arrangement, while the use of chopper-stabilized amplifiers may be advantageous from the viewpoint of circuit dimensions when the number of installed operational amplifiers is relatively small, the offset compensation method of this embodiment becomes more advantages as the number of operational amplifiers increases because the digital/analog converter and other circuit components are necessary only for the output of the analog signal processing circuit. Particularly, in the case of an analog signal processing circuit in an analog front-end signal processing LSI to be used in a CD player or a DVD player (disk drive data storage system), the circuit dimensions can be significantly reduced to by turn reduce the manufacturing cost by using the compensation method of this embodiment because the number of operational amplifiers in the circuit is very large.

Additionally, since this embodiment does not require the use of chopping clocks that are contained in chopper-stabilized amplifiers, it is free from the problem of noise and that of mutual modulation involved in chopping clocks.

Furthermore, while a chopper-stabilized amplifier can compensate only offsets attributable to amplifiers, this compensation method of this embodiment can compensate any offsets attributable to factors other than amplifiers particularly in terms of DC offsets of analog outputs. Therefore, this embodiment greatly improves the offset characteristics of the entire system. For example, it can compensate output offsets attributable to external parts (such as laser diodes of pickup heads of CD players and DVD players).

Figure 5:
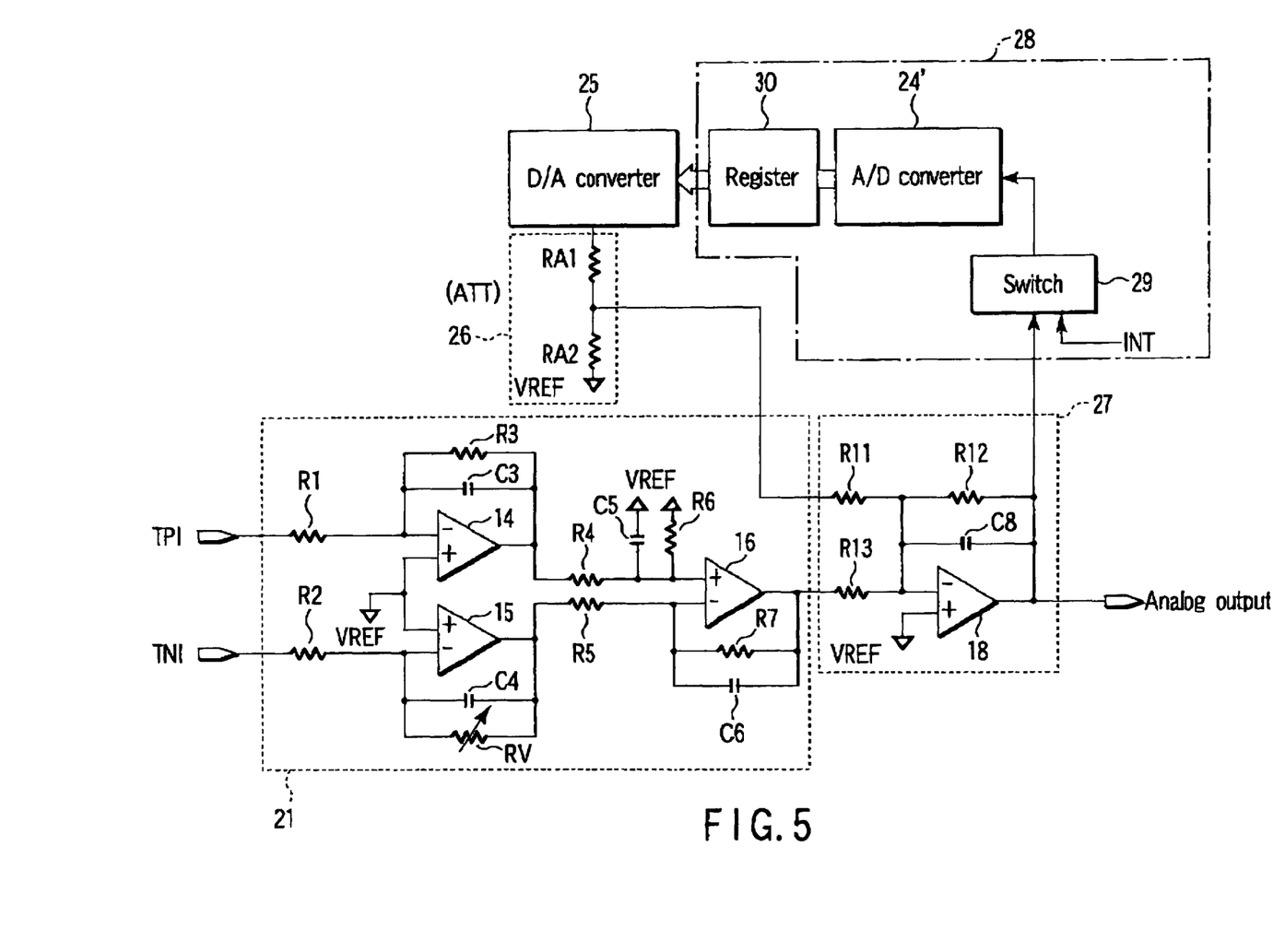
FIG. 5 is an offset compensation circuit obtained by modifying the offset compensation circuit of FIG. 4.

FIG. 5 is an offset compensation circuit obtained by modifying the offset compensation circuit of FIG. 4. This circuit is designed to make the A/D converter 24 to be shared by some other circuit on a time division basis. The output signal of the analog adder and the output buffer 27 that are combined is supplied to the A/D converter 24' that may be shared by circuit 28 of a CD player or a DVD player by way of switch 29 and converted into a digital data. Then, the obtained digital data is latched to register 30 and supplied to the D/A converter 25. The switch 29 is used to select either the output signal of the analog adder and the output buffer 27 that are combined or signal INT from an internal circuit so as to allow the A/D converter 24' to play its proper role. The register 30 is used to hold the digital data (DC output offset level) to be used for offset compensation.

With the above arrangement, the output signal of the analog adder and the output buffer 27 that are combined is selected and the digital data that is obtained by the A/D converter 24' and corresponds to the DC output offset level is supplied to and held by the register 30 immediately after the start of power supply. Then, the digital data held by the register 30 is supplied to the D/A converter 25 and converted into an analog signal by the latter. The obtained analog signal is attenuated by the attenuator 26 and added to the output signal of the analog signal processing circuit 21 so as to be used for offset compensation.

Thereafter, the switch 29 is turned to select the signal INT from an internal circuit so as to allow the A/D converter 24' to play its proper role.

With the above arrangement, since the analog/digital converter 24' operates only once for detecting the DC output offset level immediately after the start of power supply for the purpose of offset compensation, it can be shared by some other circuit on a time division basis without adversely affecting the operation of the embodiment and that of the other circuit.

Figure 6:
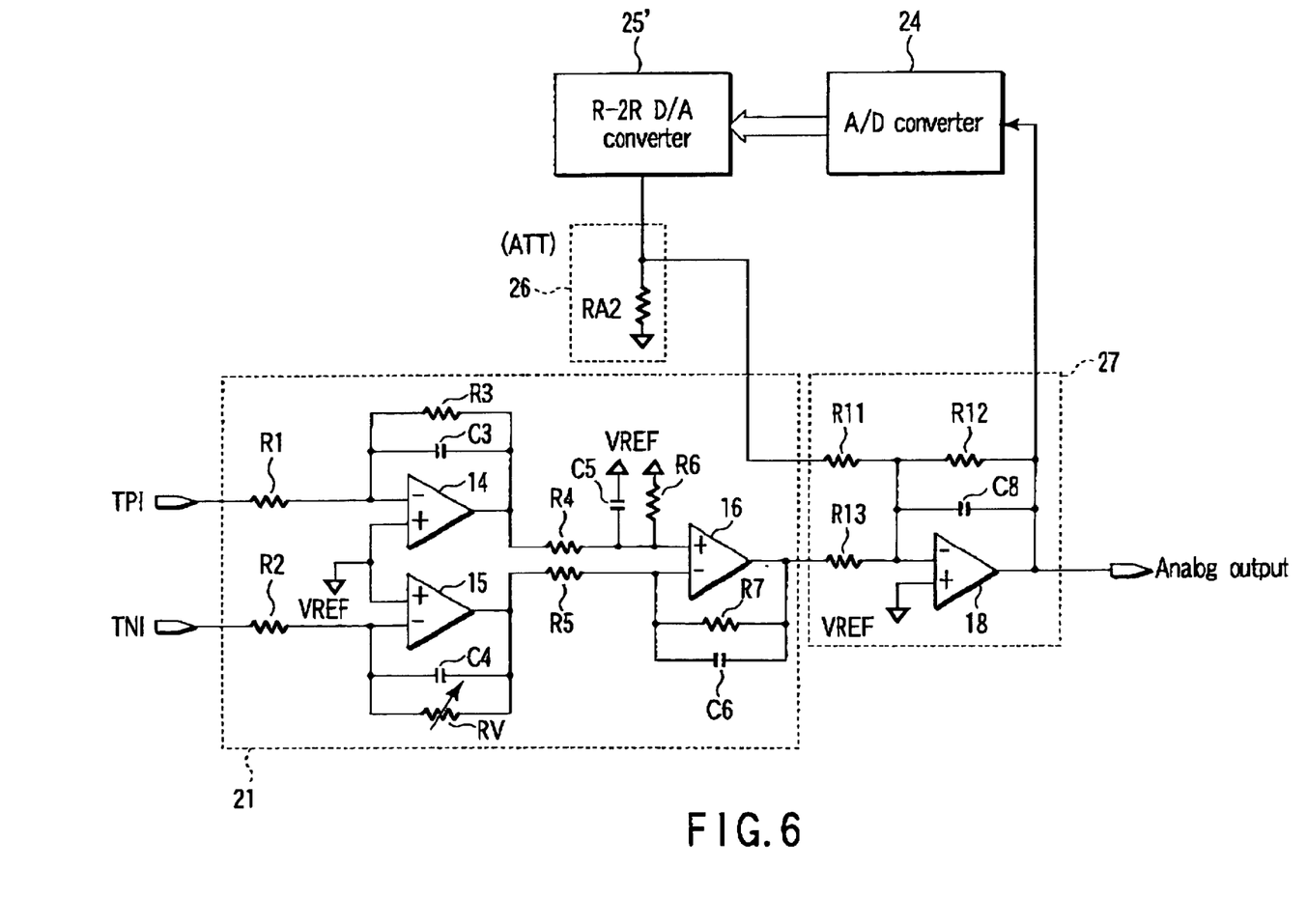
FIG. 6 is a schematic block diagram of an offset compensation circuit according to a second embodiment of this invention.

FIG. 6 is a schematic block diagram of the offset compensation circuit according to the second embodiment of this invention. An R-2R type D/A converter 25' is used for the D/A converter 25 of the first embodiment. Otherwise, the circuit of this embodiment is similar to that of FIG. 4 and hence the components same as those of the first embodiment are denoted respectively by the same reference symbols and will not be described any further.

In the R-2R type D/A converter 25', the output resistance used to operate as the resistor RA1 of FIG. 4. Therefore, the resistor RA1 of the attenuator 26 is omitted so that the attenuator 26 comprises only the resistor RA2.

Figure 7:
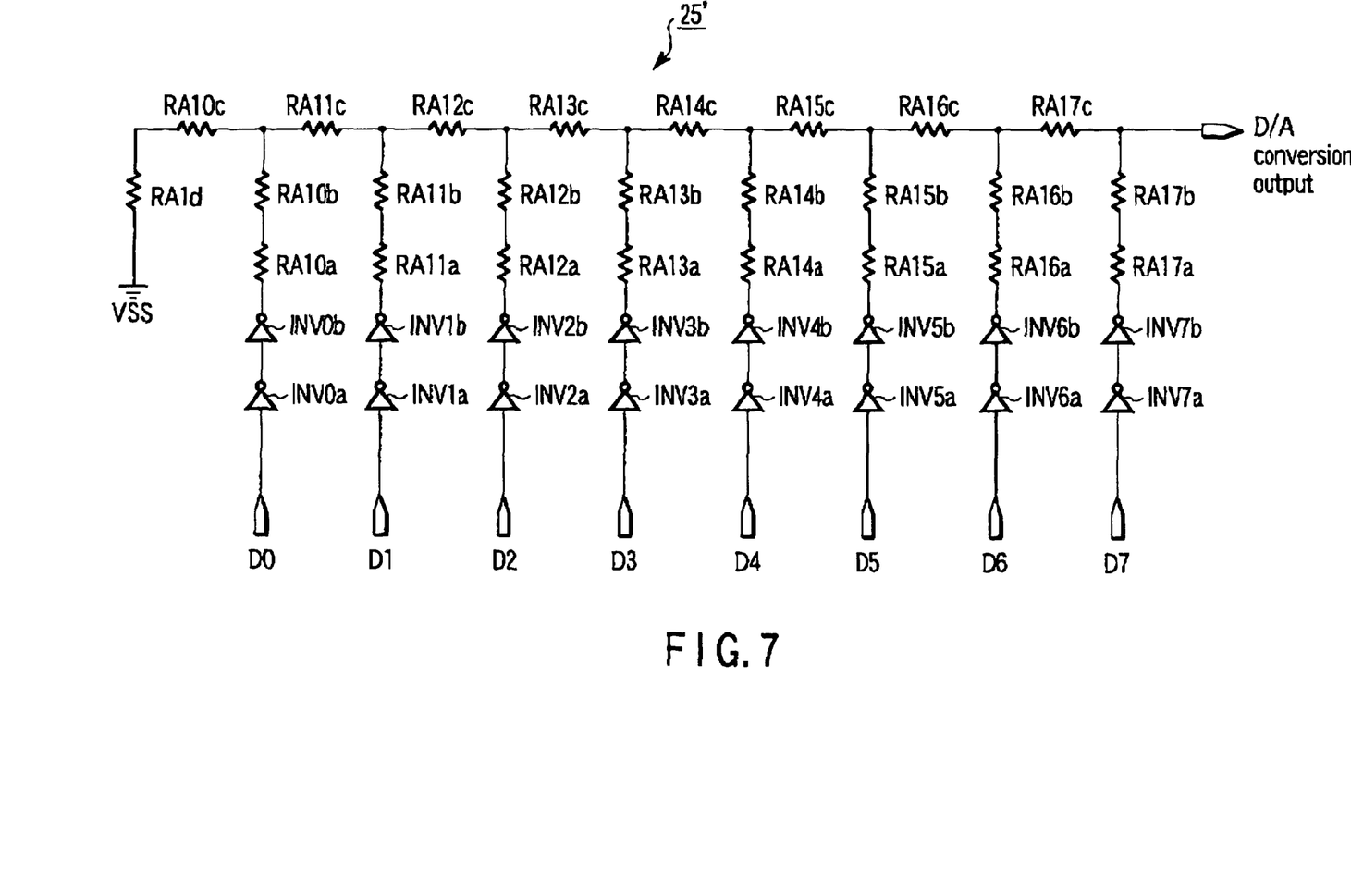
FIG. 7 is a schematic circuit diagram of an R-2R type D/A converter provided in the offset compensation circuit of FIG. 6.

FIG. 7 is a schematic circuit diagram of the R-2R type D/A 25' converter showing a resolution of 8 bits. The circuit comprises resistors RA10a through RA17a having a same resistance value, RA10b through RA17b having a same resistance value, RA10c through RA17c having a same resistance value and inverters INV0a, INV0b through INV7a, INV7b. Digital data D0 through D7 are supplied to the respective resistors RA1a through RA17a at one of the terminals of each of them by way of the inverters INV0a, INV0b through INV7a, INV7b. The other terminals of the resistors RA10a through RA17a are connected respectively to the resistors RA10b through RA17b at one of the terminals of each of them. The other terminals of the resistors RA10b through RA17b are connected respectively to the serially connected resistors RA10c through RA17c at one of the terminals of each of them. Resistor RA1d is connected between the other terminal of the resistor RA10c and the ground VSS. The D/A conversion output is obtained from the connection point of the resistor RA17b and the resistor RA17c.

With the above arrangement, if the resistance of each unit resistor R is equal to RA1, the output resistance of the digital/analog converter is also equal to RA1. Therefore, the output resistance can be used to operate as the resistor RA1 and hence the resistor RA1 can be omitted from the attenuator 26.

Figure 8:
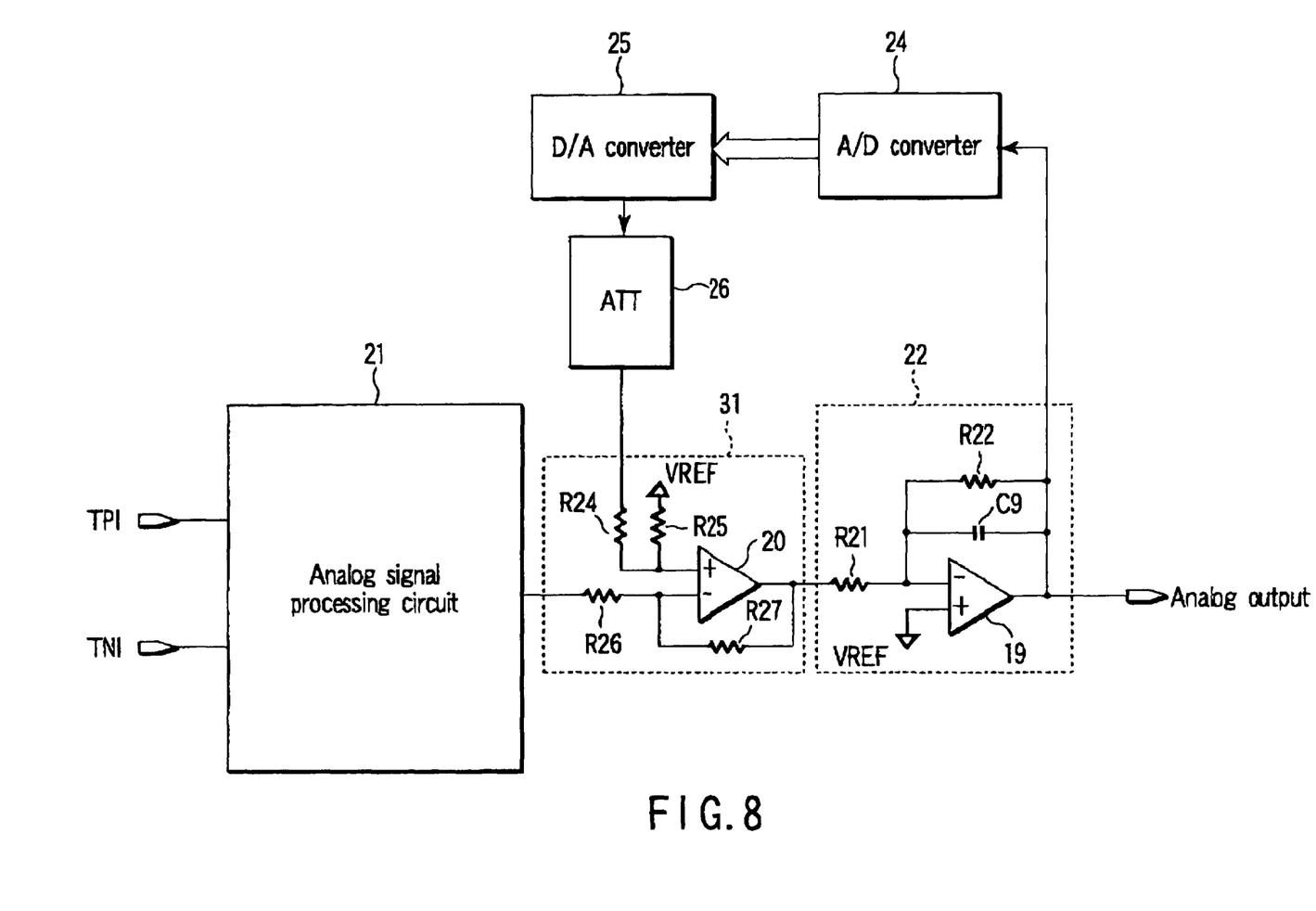
FIG. 8 is a schematic block diagram of an offset compensation circuit according to a third embodiment of this invention.

FIG. 8 is a schematic block diagram of the offset compensation circuit according to the third embodiment or this invention. This third embodiment differs from the above described first and second embodiments in that the circuit section formed by inverted buffers including an analog adder of the preceding embodiments is replaced by a circuit formed by non-inverting buffers including an analog subtracter. In other words, the output buffer 22 comprises an operational amplifier 19, resistors R21, R22 and capacitor C9. The non-inverted input terminal (+) of the operational amplifier 19 is connected to the reference voltage source VREF and the inverted input terminal (−) thereof is connected to one of the terminals of the resistor R21. The resistor R22 and the capacitor C9 are connected in parallel between the output terminal and the inverted input terminal (−) of the operational amplifier 19. The output signal of the operational amplifier 19 is output as analog signal and supplied to the A/D converter 24.

The analog abrasive 31 is formed by an operation amplifier 20 and resistors R24 through R27. The resistor R24 is connected between the non-inverted input terminal (+) of the operational amplifier 20 and the output terminal of the attenuator 26. The resistor R25 is connected between the non-inverted input terminal (+) of the operational amplifier 20 and the reference voltage source VREF. The resistor R26 is connected between the inverted input terminal (−) of the operational amplifier 20 and the output terminal of the analog signal processing circuit 21. The resistor 27 is connected between the output terminal and the inverted input terminal (−) of the operational amplifier 20.

This arrangement performs same as the comparable arrangement comprising an analog adder for offset compensation.

Figure 9:
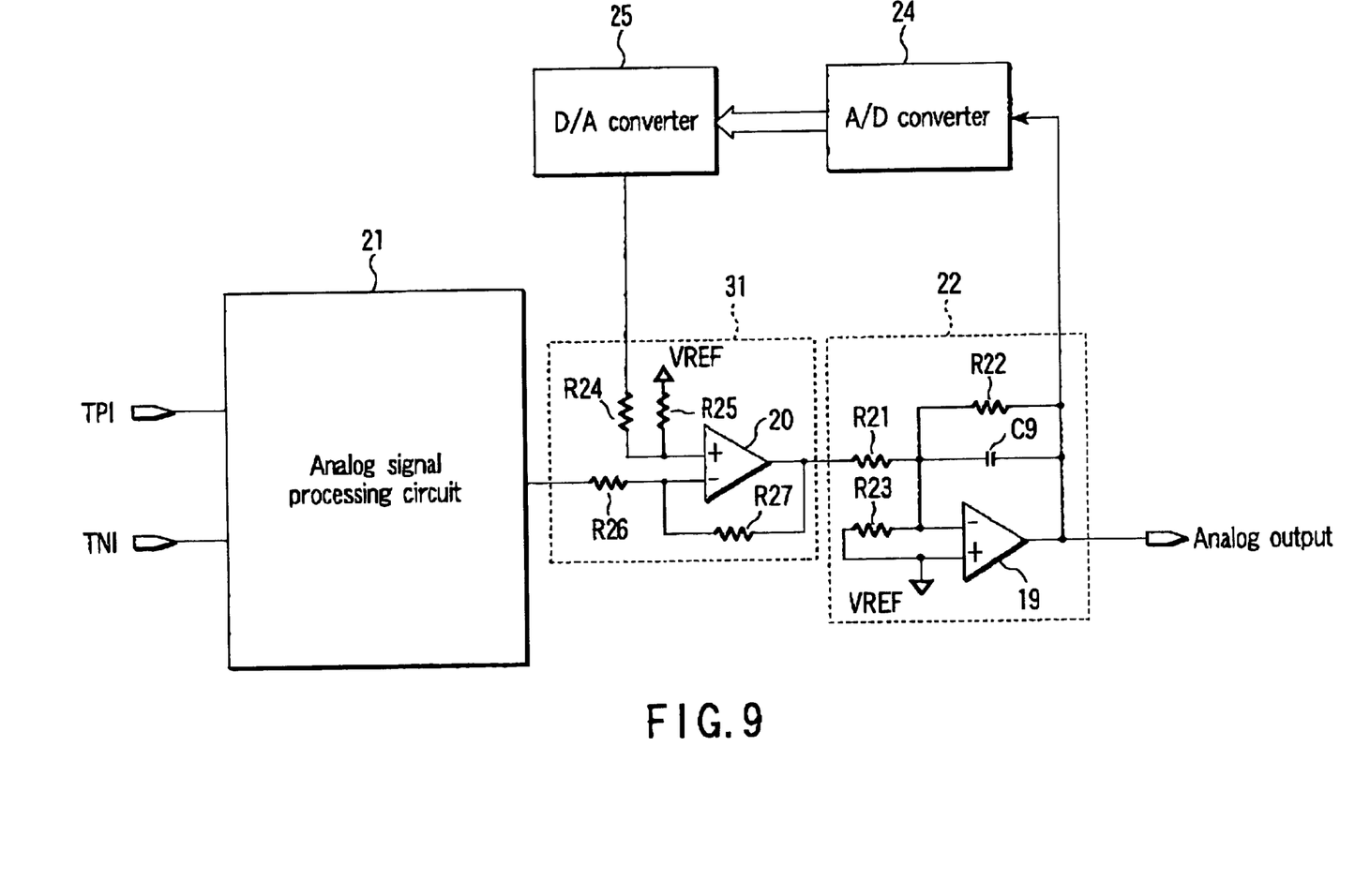
FIG. 9 is a schematic block diagram of an offset compensation circuit according to a fourth embodiment of this invention.

FIG. 9 is a schematic block diagram of the offset compensation circuit according to the fourth embodiment of this invention. This fourth embodiment differs from the above described third embodiment in that the circuit section formed by the attenuator 26 and the analog subtracter 26 in the third embodiment is replaced by an analog subtracter 31 alone. The function of the attenuator 26 is realized by the resistance ratio R25/R24 of the two resistors R25, R24 of the analog subtracter 31.

Resistor 23 is connected between the inverted input terminal (−) and the non-inverted input terminal (+) of the operational amplifier 19 of the output buffer 22.

This embodiment performs same as the above described preceding embodiments.

Figure 10:
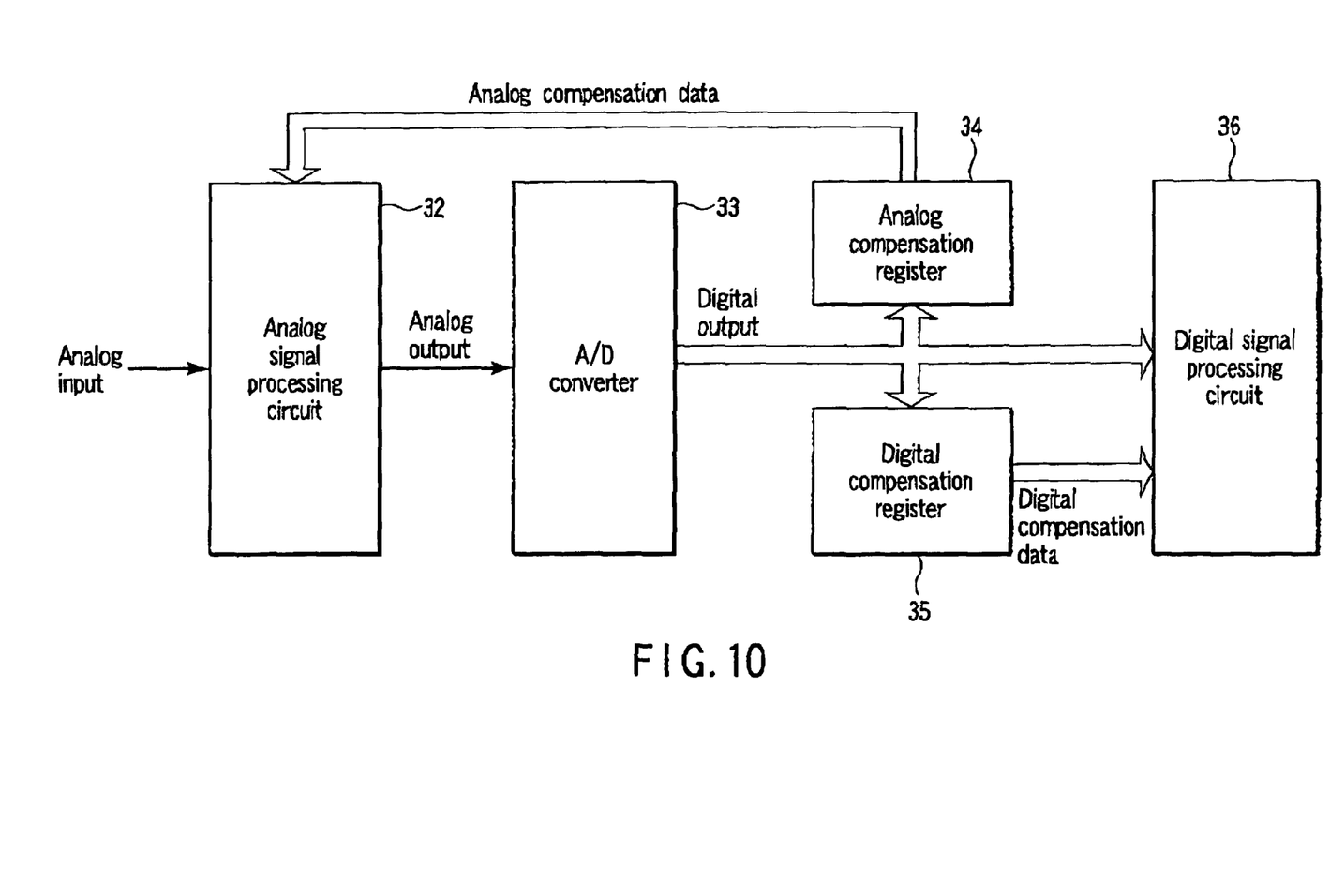
FIG. 10 is a schematic block diagram of an offset compensation circuit according to a fifth embodiment of this invention.

FIG. 10 is a schematic block diagram of the offset compensation circuit according to the fifth embodiment of this invention. In this fifth embodiment, the operation of analog offset-compensation and that of digital offset-compensation of the first through fourth embodiments are in combination used. This embodiment of offset compensation circuit comprises an analog signal processing circuit 32, an A/D converter 33, an analog compensation register 34, a digital compensation register 35 and a digital signal processing circuit 36.

More specifically, in this embodiment, firstly the output signal of the analog signal processing circuit 32 is converted into a digital data by the A/D converter 33. The digital data obtained by the conversion is held in the analog compensation register 34. The digital data held in the analog compensation register 34 is feedback to the digital/analog converter in the analog signal processing circuit 32 for an analog offset compensation as described above by referring to the first through fourth embodiments. Then, the output signal of the analog signal processing circuit that is subjected to an analog offset compensation is converted again into a digital data by means of the A/D converter 33 and the digital data obtained by the conversion is held in the digital compensation register 35 this time. The digital data held in the digital compensation register 35 is then input to the digital signal processing circuit 36 along with the digital data output form the A/D converter 33. Then, the digital data held in the digital compensation register 35 before the digital signal processing operation is subtracted from the digital data output form the A/D converter 33 to complete the digital offset-compensation.

An ordinary digital signal processing circuit compensates an offset in the form of analog data and then processes on a digital data that has been subjected to a digital offset-compensation. However, a signal subjected only to an analog offset-compensation contains a residual offset component and hence does not operate satisfactorily particularly when high accuracy offset compensation is required because of the accuracy limitations of the analog/digital converter and the gain and the variance in the analog signal processing circuit. On the other hand, a signal subjected only to a digital offset-compensation can be affected by a narrow input dynamic range because the output signal level of the analog signal processing circuit exceeds the input conversion level of the analog/digital converter particularly when the first analog input signal input to the analog signal processing circuit shows a large offset voltage.

The circuit configuration of this embodiment that is adapt to perform both an analog offset-compensation and a digital offset compensation can realize high accuracy offset compensation and accommodate a large offset voltage contained in an analog Input signal.

As described above in detail, according to an aspect of the invention, there is provided an offset compensation circuit and an offset compensation method that can minimize the circuit dimensions for the purpose of achieving a remarkable cost reduction.

According to another aspect of the invention, there is provided an offset compensation circuit and an offset compensation method that are free from the noise problem of a chopping clock and the problem of mutual modulation.

According to still another aspect of the invention, there is provided an offset compensation circuit and an offset compensation method that are free from the problem of mutual modulation where the input signal is modulated by the frequency of the chopping clock without being required to limit the operating frequency range of the input signal in any application of the product. Such an offset compensation circuit and an offset compensation method can have broader scope of application.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An offset compensation circuit comprising:

an analog/digital converter configured to measure a DC level of an inverting type analog output buffer in an analog signal processing circuit and convert an analog signal into a digital signal;

a digital/analog converter configured to receive the digital signal output from said analog/digital converter as input and convert the digital signal into an analog signal;

an attenuator configured to receive the analog signal output from said digital/analog converter as input and attenuate an amplitude of the analog signal; and an analog adder configured to receive an output signal of said attenuator and the output signal of said analog signal processing circuit as inputs, add the output signals and supply a sum signal as input signal to said inverting type analog output buffer.

2. The circuit according to claim 1, wherein an attenuation ratio of said attenuator is substantially equal to a reciprocal of a gain K (1/K) of said inverting type analog output buffer.

3. The circuit according to claim 1, wherein an attenuation ratio of said attenuator is substantially equal to a reciprocal of a product of multiplication of a gain K1 of said inverting type analog output buffer and a gain K2 of said analog/digital converter (1/(K1×K2)).

4. The circuit according to claim 1, wherein said attenuator includes a first resistor connected at an end thereof to an output terminal of said digital/analog converter and a second resistor connected between the other end of said first resistor and a reference voltage source and a connection point of said first and second resistors is connected to one of input terminals of said analog adder.

5. The circuit according to claim 1, wherein said digital/analog converter is of an R-2R type and said attenuator includes a third resistor connected between an output terminal of said R-2R type digital/analog converter and a reference voltage source, an output terminal of said R-2R type digital/analog converter being connected to one of input terminals of said analog adder.

6. The circuit according to claim 1, wherein said analog adder and said inverting type analog output buffer include an operational amplifier having its non-inverted input terminal connected to a reference voltage source, a fourth resistor connected between an inverted input terminal of said operational amplifier and an output terminal of said analog signal processing circuit, a fifth resistor connected between the inverted input terminal of said operational amplifier and the output terminal of said attenuator and a sixth resistor connected between the inverted input terminal and the output terminal of said operational amplifier.

7. An offset compensation circuit comprising:

an analog/digital converter configured to measure a DC level of a non-inverting type analog output buffer in an analog signal processing circuit and convert an analog signal into a digital signal;

a digital/analog converter configured to receive the digital signal output from said analog/digital converter as input and convert the digital signal into an analog signal;

an attenuator configured to receive the analog signal output from said digital/analog converter as input and attenuate an amplitude of the analog signal; and an analog subtracter configured to receive the output signal of said attenuator and the output signal of said analog signal processing circuit as inputs, subtract the output signal from said attenuator from the output signal from said analog signal processing circuit and supply a difference signal as input signal to said inverting type analog output buffer.

8. The circuit according to claim 7, wherein an attenuation ratio of said attenuator is substantially equal to a reciprocal of a gain K (1/K) of said non-inverting type analog output buffer.

9. The circuit according to claim 7, wherein an attenuation ratio of said attenuator is substantially equal to a reciprocal of the product of multiplication of a gain K1 of said non-inverting type analog output buffer and a gain K2 of said analog/digital converter (1/(K1×K2)).

10. The circuit according to claim 7, wherein said attenuator includes a first resistor connected at an end thereof to an output terminal of said digital/analog converter and a second resistor connected between the other end of said first resistor and a reference voltage source and a connection point of said first and second resistors is connected to one of input terminals of said analog subtracter.

11. The circuit according to claim 7, wherein said digital/analog converter is of an R-2R type and said attenuator includes a third resistor connected between an output terminal of said R-2R type digital/analog converter and a reference voltage source, an output terminal of said R-2R type digital/analog converter being connected to one of input terminals of said analog subtracter.

12. The circuit according to claim 7, wherein said analog subtracter includes a first operational amplifier, a fourth resistor connected between a non-inverted input terminal of said first operational amplifier and a reference voltage source, a fifth resistor connected between the non-inverted input terminal of said first operational amplifier and the output terminal of said attenuator, a sixth resistor connected between the inverted input terminal of said first operational amplifier and the output terminal of said analog signal processing circuit and a seventh resistor connected between the inverted input terminal and the output terminal of said first operational amplifier; and said non-inverting type analog output buffer includes a second operational amplifier having its non-inverted input terminal connected to the reference voltage source, an eighth resistor connected between the inverted input terminal of said second operational amplifier and the output terminal of said analog subtracter and a ninth resistor connected between the inverted input terminal and the output terminal of said second operational amplifier.

13. An offset compensation circuit comprising:

an analog/digital converter configured to measure a DC level of a non-inverting type analog output buffer in an analog signal processing circuit and convert an analog signal into a digital signal;

a digital/analog converter configured to receive the digital signal output from said analog/digital converter as input and convert the digital signal into an analog signal; and an analog subtracter configured to receive the output signal of said digital/analog converter and the output signal of said analog signal processing circuit as inputs, subtract the output signal from said digital/analog converter from the output signal from said analog signal processing circuit and supply a difference signal as input signal to said inverting type analog output buffer.

14. The circuit according to claim 13, wherein said analog subtracter includes a first operational amplifier, a first resistor connected between a non-inverted input terminal of said first operational amplifier and a reference voltage source, a second resistor connected between the non-inverted input terminal of said first operational amplifier and an output terminal of said digital/analog converter, a third resistor connected between an inverted input terminal of said first operational amplifier and an output terminal of said analog signal processing circuit and a fourth resistor connected between the inverted input terminal and the output terminal of said first operational amplifier; and said non-inverting type analog output buffer includes a second operational amplifier having its non-inverted input terminal connected to the reference voltage source, a fifth resistor connected between an inverted input terminal of said second operational amplifier and the output terminal of said analog subtracter, a sixth resistor connected between the inverted input terminal and the output terminal of said second operational amplifier and a seventh resistor connected between the inverted input terminal of said second operational amplifier and the reference voltage source, wherein an attenuation ratio being defined by a ratio of a resistance of said first resistor and that of said second resistor.

15. An offset compensation circuit comprising:

an analog/digital converter configured to measure a DC level of an analog output buffer in an analog signal processing circuit and convert an analog signal into a digital signal; and first and second register circuits configured to receive and hold the digital signal output from said analog/digital converter, wherein the digital signal held by said first register circuit is input to said analog signal processing circuit and used for analog offset-compensation, and the digital signal held by said second register circuit is input to a digital signal processing circuit and used for digital offset-compensation.

16. The circuit according to claim 15, wherein the digital signal held by said first register is used for analog offset-compensation, the DC level of the analog output buffer of the analog signal processing circuit is measured again by said analog/digital converter after the analog offset-compensation and the output digital signal being input to and held by said second register circuit.

17. A semiconductor integrated circuit device provided with an analog signal processing circuit comprising an offset compensation circuit arranged at an output section of said analog signal processing circuit, said offset compensation circuit including:

an analog/digital converter configured to measure a DC level of an inverting type analog output buffer in an analog signal processing circuit and convert an analog signal into a digital signal;

a digital/analog converter configured to receive the digital signal output from said analog/digital converter as input and convert the digital signal into an analog signal;

an attenuator configured to receive the analog signal output from said digital/analog converter as input and attenuate an amplitude of the analog signal; and an analog adder configured to receive the output signal of said attenuator and the output signal of said analog signal processing circuit as inputs, add the output signals and supply a sum signal as input signal to said inverting type analog output buffer.

18. The device according to claim 17, wherein said analog signal processing circuit processes an analog front-end signal.

19. A semiconductor integrated circuit device provided with an analog signal processing circuit comprising an offset compensation circuit arranged at an output section of said analog signal processing circuit, said offset compensation circuit including:

an analog/digital converter configured to measure a DC level of a non-inverting type analog output buffer in an analog signal processing circuit and convert an analog signal into a digital signal;

a digital/analog converter configured to receive the digital signal output from said analog/digital converter as input and convert the digital signal into an analog signal;

an attenuator configured to receive the analog signal output from said digital/analog converter as input and attenuate an amplitude of the analog signal; and an analog subtracter configured to receive the output signal of said attenuator and the output signal of said analog signal processing circuit as inputs, subtract the output signal from said attenuator from the output signal from said analog signal processing circuit and supply a difference signal as input signal to said inverting type analog output buffer.

20. The device according to claim 19, wherein said analog signal processing circuit processes an analog front-end signal.

21. A semiconductor integrated circuit device provided with an analog signal processing circuit comprising an offset compensation circuit arranged at an output section of said analog signal processing is circuit, said offset compensation circuit including;

an analog/digital converter configured to measure a DC level or a non-inverting type analog output buffer in an analog signal processing circuit and convert an analog signal into a digital signal;

a digital/analog converter configured to receive the digital signal output from said analog/digital converter as input and convert the digital signal into an analog signal; and an analog subtracter configured to receive the output signal of said digital/analog converter and the output signal of said analog signal processing circuit as inputs, subtract the output signal from said digital/analog converter from the output signal from said analog signal processing circuit and supply a difference signal as input signal to said inverting type analog output buffer.

22. The device according to claim 21, wherein said analog signal processing circuit processes an analog front-end signal.

23. A semiconductor integrated circuit device provided with an analog signal processing circuit comprising an offset compensation circuit arranged at an output section of said analog signal processing circuit, said offset compensation circuit including:

an analog/digital converter configured to measure a DC level of an analog output buffer in an analog signal processing circuit and convert an analog signal into a digital signal; and first and second register circuits configured to receive and hold the digital signal output from said analog/digital converter, wherein the digital signal held by said first register circuit is input to said analog signal processing circuit and used for analog offset-compensation, and the digital signal held by said second register circuit being input to a digital signal processing circuit and used for digital offset-compensation.

24. The device according to claim 23, wherein said analog signal processing circuit processes an analog front-end signal.

25. An offset compensation method comprising:

detecting a DC output offset of an inverting type analog output buffer in an analog signal processing circuit and converting the DC output offset into a digital signal;

converting the detected DC output offset level into an analog signal level;

attenuating the analog signal level produced by the conversion by an extent equal to the gain of the analog output buffer;

adding the attenuated analog signal and the output signal of the analog signal processing circuit and supplying a sum signal to the analog output; and obtaining an output signal from said analog output buffer.

26. An offset compensation method comprising:

detecting a DC output offset of a non-inverting type analog output buffer in an analog signal processing circuit and converting the DC output offset into a digital signal;

converting the detected DC output offset level into an analog signal level;

attenuating the analog signal level produced by the conversion by an extent equal to the gain of the analog output buffer;

subtracting the attenuated analog signal from the output signal of said analog signal processing circuit and supplying a difference signal to the analog output; and obtaining an output signal from said analog output buffer.

27. An offset compensation method comprising:

detecting a DC output offset of a non-inverting type analog output buffer in an analog signal processing circuit and converting the DC output offset into a digital signal;

converting the detected DC output offset level into an analog signal level;

subtracting the analog signal level from the output signal of said analog signal processing circuit and supplying a difference signal to the analog output; and obtaining an output signal from said analog output buffer.

28. An offset compensation method comprising:

detecting a DC output offset of an analog output buffer in an analog signal processing circuit and converting the DC output offset into a digital signal;

holding the detected digital signal in a first register circuit;

feeding back the digital signal held in said first register circuit to said analog signal processing circuit and analog compensation the offset;

detecting the DC output offset of an analog output buffer in said analog signal processing circuit and converting the DC output offset again into a digital signal;

holding the detected digital signal in a second register; and inputting the digital signal held in said second register into a digital signal processing circuit and digital compensation the offset.

* * * * *